United States Patent
Lee et al.

(10) Patent No.: US 6,308,573 B1
(45) Date of Patent: Oct. 30, 2001

(54) 3-DIMENSIONAL COMB STRUCTURE AND ACTUATOR AND INERTIA DETECTION SENSOR BOTH USING THE COMB STRUCTURE

(75) Inventors: Ki Bang Lee, Seoul; Jae-joon Choi, Sungnam; Hee-moon Jeong, Yongin; Kyu-yong Kim, Sungnam; Sung-gyu Kang, Suwon, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/479,892

(22) Filed: Jan. 10, 2000

(30) Foreign Application Priority Data

Jan. 11, 1999 (KR) ........................................... 99-387

(51) Int. Cl.$^7$ ................. G01P 3/44; G11B 5/55
(52) U.S. Cl. .................... 73/652; 73/504.12; 73/504.08; 310/309; 360/294.2
(58) Field of Search ............................ 73/504.02, 504.04, 73/504.03, 504.12, 504.08, 504.14, 504.15, 504.16, 514.01, 105, 652, 654, 662; 310/308, 309; 360/294.2

(56) References Cited

U.S. PATENT DOCUMENTS

| | | | |
|---|---|---|---|
| 5,591,896 | * 1/1997 | Lin ........................................ | 73/31.05 |
| 5,640,133 | * 6/1997 | MacDonald et al. ................. | 333/197 |
| 5,895,852 | * 4/1999 | Moriya et al. ..................... | 73/504.12 |
| 5,959,808 | * 9/1999 | Fan et al. ............................. | 360/106 |
| 5,982,585 | * 11/1999 | Fan et al. ............................. | 360/104 |
| 6,000,280 | * 12/1999 | Miller et al. ........................... | 73/105 |
| 6,175,069 | * 1/2001 | Suzuki ............................. | 360/294.5 |

* cited by examiner

Primary Examiner—Hezron Williams
Assistant Examiner—Rose M. Miller
(74) Attorney, Agent, or Firm—Burns, Doane, Swecker & Mathis, L.L.P.

(57) ABSTRACT

A 3-dimensional comb structure using an electrical force, and an inertial detection sensor and an actuator both using the 3-dimensional comb structure are provided. In the 3-dimensional comb structure, a suspension structure, which is an inertia body, is separated a predetermined height from a substrate, maintaining the predetermined height from the substrate. A movable comb, which has at least one movable comb finger, protrudes perpendicularly from the suspension structure. A fixed comb, which has at least one fixed comb finger, protrudes perpendicularly from the substrate, in mesh with the movable comb. The 3-dimensional comb structure is driven by a voltage provided from a power supply unit which is connected to the movable comb and the fixed comb.

23 Claims, 4 Drawing Sheets

3-DIMENSIONAL COMB STRUCTURE AND ACTUATOR AND INERTIA DETECTION SENSOR BOTH USING THE COMB STRUCTURE

BACKGROUND OF THE INVENTION

1. Field of the Invention

The present invention relates to a 3-dimensional comb structure using an electrostatic force, and an inertia detection sensor and an actuator which uses the 3-dimensional comb structure.

2. Description of the Related Art

A 3-dimensional comb structure using an electrostatic force protrudes perpendicularly with respect to a flat plane surface, and has a structure such that an electrostatic force, which is generated between a pair of interlocked combs by applying a voltage thereto, is constant with respect to the relative motion between the combs.

In many cases, electrostatic actuators are used to move micro structures. An electrostatic comb drive (U.S. Pat. No. 5,025,346) is well known as an electrostatic actuator. The basic principle of the electrostatic comb drive will now be described with reference to FIG. 1.

A pair of combs 1 and 2 mesh with each other with a gap s between fingers thereof. When a power supply 3 is connected to each of the combs 1 and 2 via conductive wires 4 and 5, respectively, a horizontal electrostatic force ($F_s$) 6 acting upon a finger of the comb 2 is expressed by the following Equation 1:

$$F_S = \varepsilon_0 \frac{t}{s} V^2 \qquad (1)$$

wherein $\varepsilon_0$, t, s and V denote the permittivity of free space, the thickness of a finger in a direction perpendicular to the surface, the interval between a finger of the comb 1 and an adjacent finger of the comb 2, and a voltage 3 applied to a bridge between fingers, respectively. The electrostatic comb drive can be manufactured by a CMOS process such as a process for manufacturing a semiconductor RAM, and has a constant force with respect to the motion of a comb, as shown in Equation 1.

FIG. 2 disclosed in U.S. Pat. No. 5,025,346 can be taken as an example of an actuator using the principle of FIG. 1, which is the principle of an existing electrostatic comb drive. This electrostatic actuator 20 includes a mass body 22 having a plurality of movable comb fingers 27, at least one elastic member 23 connected to the mass body 22, and a plurality of fixed combs 25 which are meshed with the movable comb fingers 27, facing the movable comb fingers 27. Here, the plurality of movable comb fingers 27 are supported by a substrate 21 via supporters 24, and the fixed comb fingers 25 are supported by the substrate 21 via fixed comb supporters 26. When a voltage is applied to the fixed comb fingers 25 and the movable comb fingers 27 via an appropriate means (not shown), the mass body 22 is moved linearly in a horizontal direction with respect to the substrate 21 by the electrostatic force generated by Equation 1. The electrostatic force generated in this structure is constant with respect to the distance of motion, as shown in Equation 1. However, according to this structure, the movable comb fingers 27 and the fixed comb fingers 25 are parallel to the substrate 21. Also, since the movable comb fingers 27 and the fixed comb fingers 25 are installed on both ends of the flat mass body which is parallel to the substrate 21, the number of combs can increase in proportion to the length of each end of the mass body. Thus, an electrostatic force is small due to the limit in the number of combs. Furthermore, the mass body must move largely to be used in acceleration sensors or gyro sensors. However, in this conventional comb structure, a small amount of electrostatic force makes it difficult to directly drive the mass body, so that the mass body can only be driven at the resonance point.

SUMMARY OF THE INVENTION

To solve the above problems, an objective of the present invention is to provide a 3-dimensional comb structure which is strong enough to drive a large-sized structure and having fingers arranged perpendicularly over a flat plane to make it easy to control the position of the structure, and an actuator and an inertia detection sensor both using the 3-dimensional comb structure.

To achieve the above objective of the invention, there is provided a 3-dimensional comb structure including: a substrate; a suspension structure separated a predetermined height from the substrate, maintaining the predetermined height therefrom, such that the suspension structure can vibrate over the substrate to detect an inertial movement; at least one elastic member connected to the suspension structure, for supporting the suspension structure so that the suspension structure makes an inertial movement; a movable comb having at least one comb finger, the movable comb protruding from the suspension structure; and a fixed comb having at least one comb finger, the fixed comb fingers protruding from the substrate opposite to and in mesh with the movable comb fingers.

In the present invention, preferably, an electrostatic force is generated perpendicular to the direction of protrusion of the movable comb fingers from the suspension structure, when a voltage is applied to the movable comb and the fixed comb, so that the 3-dimensional comb structure is excited parallel to the substrate. It is preferable that the movable comb is meshed with the fixed comb having a predetermined gap between a finger of the movable comb and a finger of the fixed comb.

It is also preferable that the movable comb and the fixed comb face each other, and are arranged on the suspension structure and the substrate, respectively, in a circular symmetrical manner, such that the suspension structure is horizontal to the substrate and rotates around the center of the circular symmetry.

To achieve the above objective of the invention, there is provided an inertia detection sensor adopting a 3-dimensional comb structure including: a substrate; a suspension structure separated a predetermined height from the substrate, maintaining the predetermined height therefrom, such that the suspension structure can vibrate over the substrate to detect an inertial movement; at least one elastic member connected to the suspension structure, for supporting the suspension structure so that the suspension structure makes an inertial movement; a movable comb having at least one comb finger, the movable comb protruding from the suspension structure; a fixed comb having at least one comb finger, the fixed comb fingers protruding from the substrate opposite to and in mesh with the movable comb fingers; and a sensing unit for detecting an acceleration by sensing a capacity change between the movable comb and the fixed comb.

Preferably, an electrostatic force is generated perpendicular to the direction of protrusion of the movable comb fingers from the suspension structure, when a voltage is applied to the movable comb and the fixed comb, so that the 3-dimensional comb structure is excited parallel to the substrate. It is preferable that the movable comb is meshed with the fixed comb having a predetermined gap between a finger of the movable comb and a finger of the fixed comb.

It is also preferable that the movable comb and the fixed comb face each other, and are arranged on the suspension structure and the substrate, respectively, in a circular symmetrical manner, such that the suspension structure is horizontal to the substrate and rotates around the center of the circular symmetry.

To achieve the above objective of the invention, there is provided an actuator adopting a 3-dimensional comb structure comprising: a substrate; a suspension structure separated a predetermined height from the substrate, maintaining the predetermined height therefrom, such that the suspension structure can vibrate over the substrate to detect an inertial movement; at least one elastic member connected to the suspension structure, for supporting the suspension structure so that the suspension structure makes an inertial movement; a movable comb having at least one comb finger, the movable comb protruding from the suspension structure; a fixed comb having at least one comb finger, the fixed comb fingers protruding from the substrate opposite to and in mesh with the movable comb fingers; and a power supply for providing a voltage between the movable comb and the fixed comb to excite the suspension structure.

Preferably, an electrostatic force is generated perpendicular to the direction of protrusion of the movable comb fingers from the suspension structure, when a voltage is applied to the movable comb and the fixed comb, so that the 3-dimensional comb structure is excited perpendicular to the direction of protrusion of the fixed comb. It is preferable that the movable comb is meshed with the fixed comb having a predetermined gap between a finger of the movable comb and a finger of the fixed comb.

BRIEF DESCRIPTION OF THE DRAWINGS

The above objectives and advantage of the present invention will become more apparent by describing in detail preferred embodiments thereof with reference to the attached drawings in which.

DESCRIPTION OF THE PREFERRED EMBODIMENTS

Figure 3:
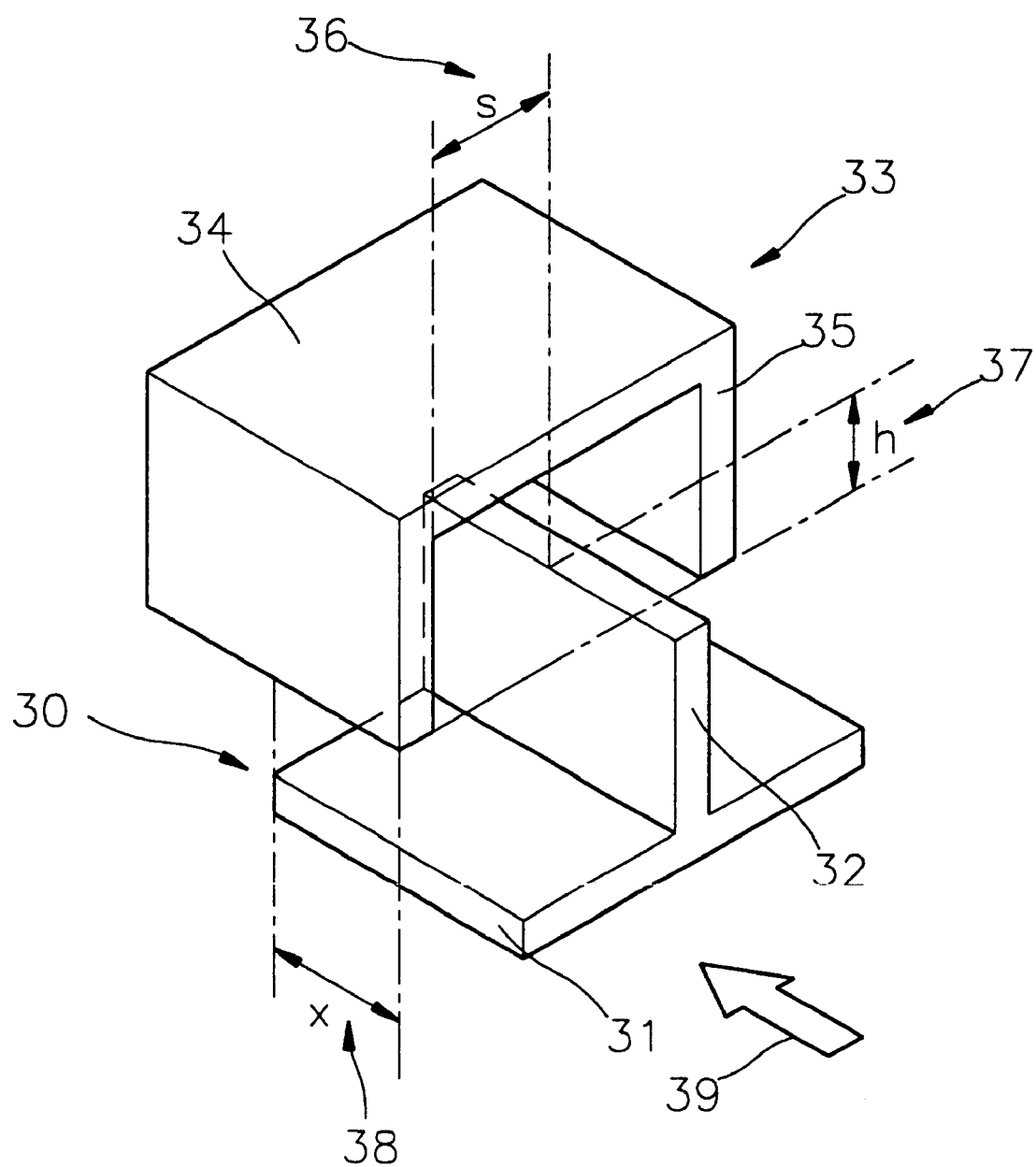
FIG. 3 is a perspective view illustrating the basic structure of a 3-dimensional comb structure which is used in an inertia detection sensor and an actuator according to the present invention.

Referring to FIG. 3, a 3-dimensional comb structure using an electrostatic force according to the present invention includes at least one fixed comb finger 32 installed perpendicularly on a substrate 31, and at least one movable comb finger 35 which is meshed with the fixed comb finger 32, opposite to the fixed comb finger 32. The fixed comb finger 32 and the movable comb finger 35 are spaced apart by a gap s, and overlap with each other by a distance h in a perpendicular direction with respect to the substrate 31. A pair of comb fingers 32 and 35 are electrically connected to each other, as shown in FIG. 3, such that they are driven by an electrical field which is generated between them by a voltage provided from a power supply means 36.

As shown in FIG. 3, when a voltage is applied from the power supply means 36, a capacitor is formed between the fixed comb finger 32 and the movable comb finger 35, so that energies are stored by charge. The capacitance C of the capacitor formed at this time is expressed by the following Equation 2:

$$C = \varepsilon_0 \frac{hx}{s} \qquad (2)$$

wherein $\varepsilon_0$, s, h, and x denote the permittivity of a gap, the gap between comb fingers, the length by which a pair of comb fingers overlap each other perpendicularly with respect to a substrate, and the length by which a pair of comb fingers overlap each other in parallel to the substrate, respectively. Since the gap s exists between two comb fingers, as shown in FIG. 3, an energy U stored in the capacitor is expressed by the following Equation 3 using the capacitance given by Equation 2:

$$U = 2\frac{1}{2}CV^2 = \varepsilon_0 \frac{hx}{s}V^2 \qquad (3)$$

A force F which is applied to the movable comb finger 32 and the fixed comb finger 35 parallel to the substrate 31, that is, in a direction indicated by arrow 39 in FIG. 3, is given by the following Equation 4:

$$F = \frac{\partial U}{\partial x} = \varepsilon_0 \frac{h}{s}V^2 \qquad (4)$$

Equation 4 calculates the electrostatic force between the movable comb finger 32 and the fixed comb finger 35 with reference to the basic conceptual diagram showing the operational principle of a 3-dimensional comb structure according to the present invention shown in FIG. 3. It can be seen from Equation 4 that the electrostatic force F acts in a perpendicular direction to the movable comb finger 32 and the fixed comb finger 35, that is, in the direction 39 parallel to the substrate 31.

Figure 4:
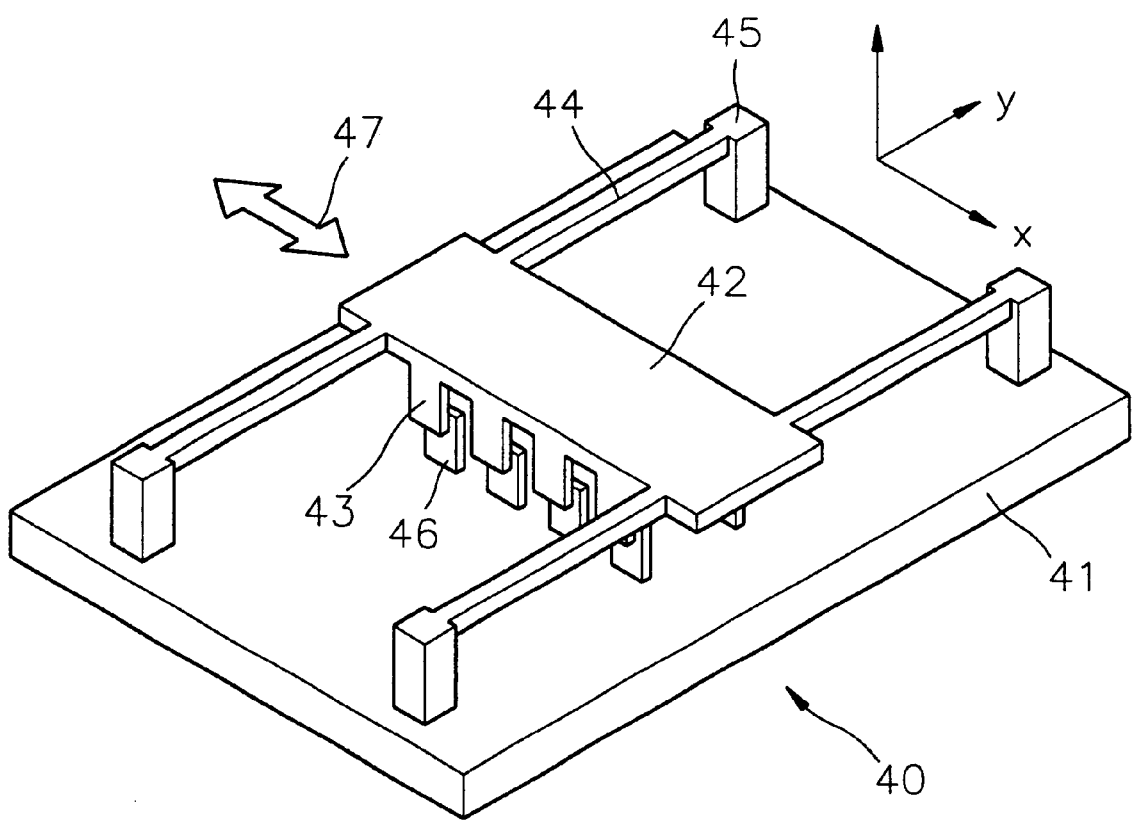
FIG. 4 is a perspective view illustrating an embodiment of a straight-forwarding actuator using the 3-dimensional comb structure of FIG. 3.

An embodiment of the 3-dimensional comb structure using an electrostatic force having such a configuration will now be described with reference to FIG. 4. Referring to FIG. 4, which shows an embodiment of a straight-vibrating driver using the 3-dimensional comb structure of FIG. 3, a suspension structure 42 has a plurality of movable comb fingers 43 which protrude perpendicularly thereto, and supported by a substrate via a plurality of support springs 44 and a plurality of supporters 45. A plurality of fixed comb fingers 46 are arranged opposite to and in mesh with the movable comb fingers 43, and supported by the substrate 41. This 3-dimensional comb structure is driven by an electrostatic force, as described with reference to FIG. 3. Here, the vertical width of the support springs 44 is made larger than the horizontal width thereof with respect to the substrate, such that each of the support springs 44 moves with a flexible elasticity in a horizontal direction indicated by arrow 47, and is fixed without flexibility in the vertical direction. That is, when the vertical width of the support spring in FIG. 4 is h, the horizontal width thereof is b, the length thereof is L, and the rigidity thereof is K, the rigidity in an excitation direction and that in a measuring direction are expressed by the following Equation 5:

$$K_x = \frac{Eb^3h}{12L}, K_z = \frac{Ebh^3}{12L} \quad (5)$$

It can be seen from Equation 5 that the horizontal rigidity and the vertical rigidity of the support spring 44 are proportional to the cube of the horizontal width and the cube of the vertical width, respectively.

When a voltage is applied from a power supply means (not shown) to the movable comb fingers 43 and the fixed comb fingers 46, a capacitance as given by Equation 2 is formed between the movable comb fingers 43 and the fixed comb fingers 46. Also, the force given by Equation 4 is generated in a direction which is parallel to the substrate, thus moving the suspension structure 42 to the right. Here, when the voltage from the power supply means (not shown) is an alternating current voltage, the support spring 44 allows the suspension structure 42 to reciprocate in the directions indicated by double-headed arrow 47 according to the applied alternating current voltage while supporting the suspension structure 42. In order to achieve this operation, it is preferable that the plurality of supporters 45 are electrically insulated from the substrate 41.

Figure 1:
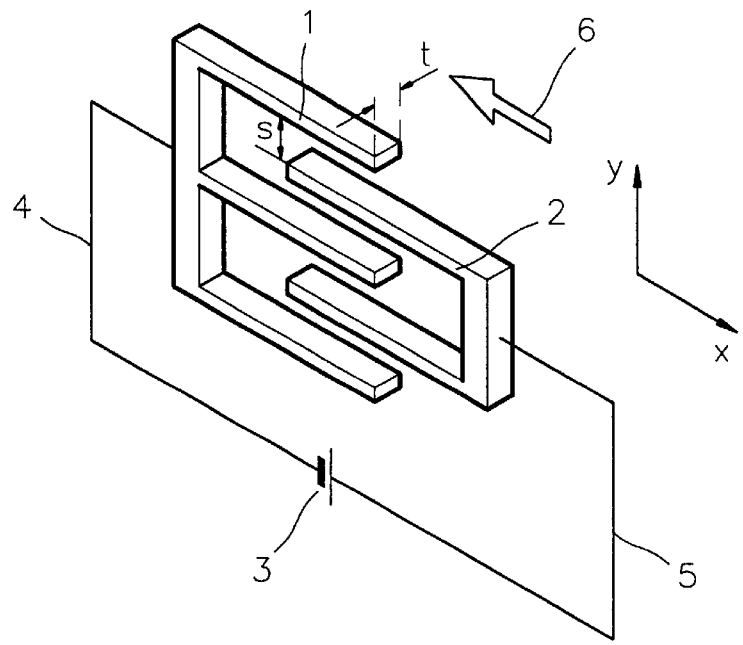
FIG. 1 is a plan view schematically illustrating the configuration of a conventional comb structure using an electrostatic force.
Figure 2:
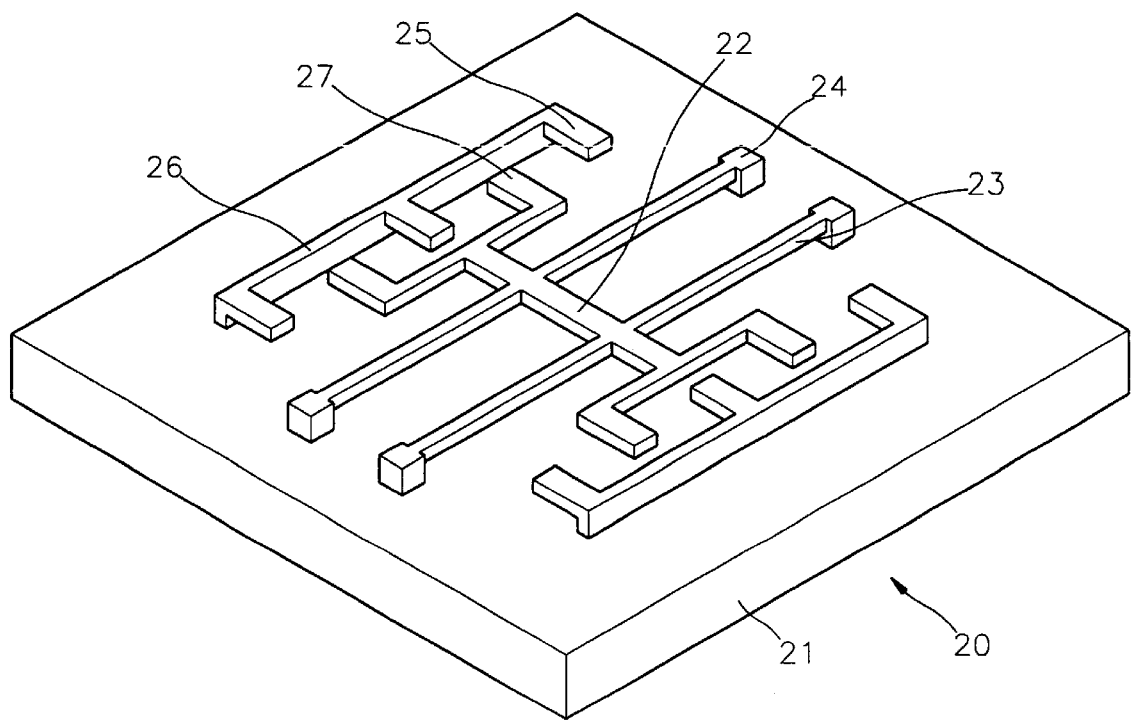
FIG. 2 is a perspective view illustrating an embodiment of an actuator employing the comb structure of FIG. 1.

In an existing comb structure, combs are installed on both ends of a mass body, such that the number of comb fingers can be increased in proportion to the length of the mass body. On the other hand, in the 3-dimensional comb structure according to the present invention, comb fingers protrude perpendicularly with respect to the mass body, such that the number of comb fingers can be increased in proportion to the area of the mass body. Therefore, the 3-dimensional comb structure according to the present invention can increase the number of comb fingers per unit area as compared to the existing comb structure shown in FIG. 2, so that it becomes much stronger. This structure is used in various actuators and inertial detection sensors.

An acceleration detection sensor can be taken as an example of an inertia detection sensor which adopts the 3-dimensional comb structure using an electrostatic force. The suspension structure 42 in the comb structure of FIG. 4 is spaced from the substrate 41 by a given distance, such that it can move in the horizontal direction 47 with respect to the substrate 41. At this time, when an acceleration in a direction indicated by arrow x is applied, the suspension structure 42 moves in the direction indicated by arrow x. This motion is sensed as a capacitance change caused by the movable comb fingers 43 and the fixed comb fingers 46, thereby detecting the variation in acceleration.

A gyro sensor can be taken as another example of an inertia detection sensor which adopts the 3-dimensional comb structure using an electrostatic force. While the suspension structure 42 in FIG. 4 moves in the horizontal direction 47 with respect to the substrate 41, a Coriolis force in a direction indicated by arrow z is generated when an acceleration is applied in a direction indicated by arrow y, thus vibrating the suspension structure 42 in the direction indicated by arrow z. This vibration is sensed by an appropriate sensor (not shown in FIG. 4), thereby detecting the applied acceleration.

The 3-dimensional comb structure using an electrostatic force according to the present invention can also be used in a variety of actuators for moving a suspension structure which is an inertia body, and in various inertial sensors and magnetic flux detection sensors.

Figure 5:
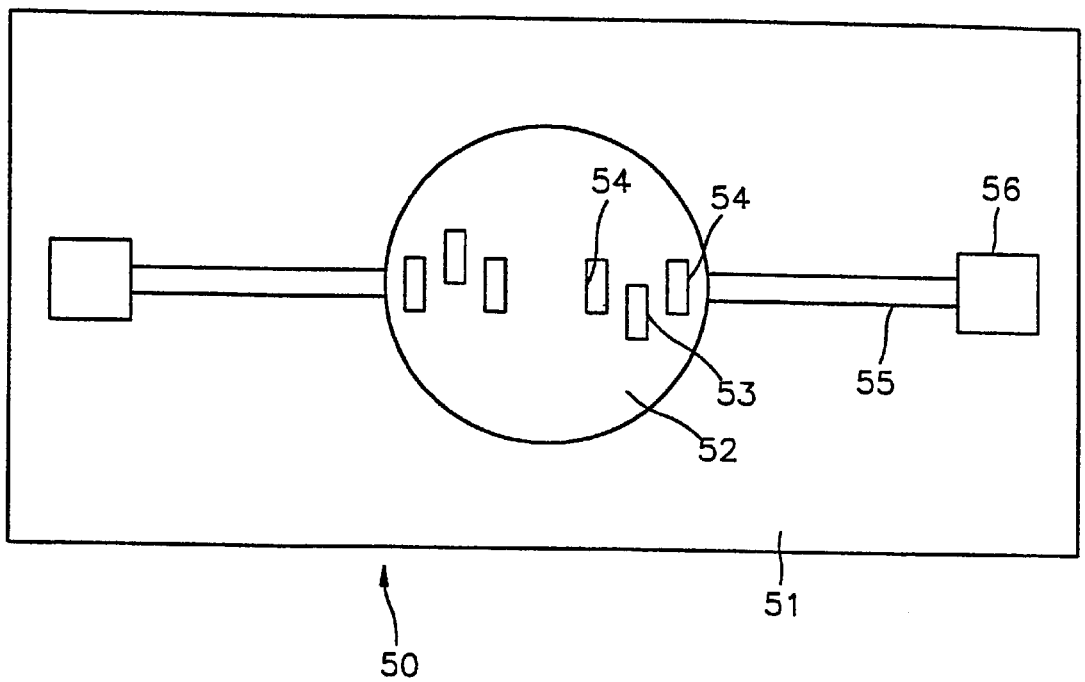
FIG. 5 is a plan view illustrating an embodiment of a rotary 3-dimensional comb structure which is used in an inertia detection sensor and an actuator according to the present invention.

FIG. 5 is a schematic view illustrating a rotary driving structure 50 taken as an example of still another embodiment of the 3-dimensional comb structure according to the present invention. In this embodiment which is a structure which can apply a force to a circular structure, a rotary suspension structure 52 has a plurality of movable comb fingers 53 which protrude perpendicularly with respect to the rotatory suspension structure 52, and is supported by a substrate 51 while maintaining a predetermined distance from the substrate 51 via a plurality of support springs 55 and a plurality of supporters 56. At least one fixed comb finger 54, which is installed in opposite to and mesh with the movable comb fingers 53, stands perpendicularly on the substrate 51. The operational principle of this comb structure is similar to that of the aforementioned comb structure.

Figure 6:
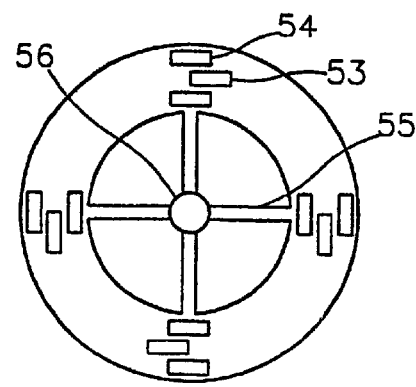
FIG. 6 is a plan view illustrating another embodiment of the rotary 3-dimensional comb structure of FIG. 5.

When a voltage is applied from a power supply means (not shown) to the movable comb fingers 53 and at least one fixed comb finger 54, a capacitance as given by Equation 2 is formed between the movable comb fingers and the fixed comb finger, and a force given by Equation 4 is generated parallel to the substrate, thus rotating the rotary suspension structure 52. Here, when the voltage applied from the power supply means is an alternating current voltage, a support spring 55 allows the rotary suspension structure 52 to reciprocate a circular arc section having a predetermined angle according to the applied alternating current voltage, while supporting the rotary suspension structure 52. In order to achieve this operation, it is preferable that the supporters 56 are electrically insulated from the substrate 51 to prevent flow of current. The operational principle of FIG. 6, in which the supporter is positioned at the center of a rotary mass body, is the same as that of the structure shown in FIG. 5. The structures shown in FIGS. 5 and 6 can be used in various actuators and sensors according to the principle described in the latter part of the description of the structure shown in FIG. 4.

As described above, in a 3-dimensional comb structure according to the present invention and an inertial detection sensor and an actuator both using the 3-dimensional comb structure, a suspension structure, which is an inertia body, is separated a predetermined height from a substrate, maintaining the predetermined height from the substrate. A movable comb, which has at least one movable comb finger, protrudes perpendicularly from the suspension structure. A fixed comb, which has at least one fixed comb finger, protrudes perpendicularly from the substrate, in mesh with the movable comb. The 3-dimensional comb structure is driven by a voltage provided from a power supply unit which is connected to the movable comb and the fixed comb, so that the actuator and the inertial detection sensor both using the 3-dimensional comb structure can obtain the following effects.

Firstly, since comb fingers are manufactured perpendicular to the suspension structure and the substrate, the present invention can greatly increase the number of comb fingers per unit area as compared to an existing driver. Thus, the present invention can reinforce an electrostatic force greater than an existing comb driver.

Secondly, the direction of an electrostatic force in the existing comb structure is the same as that of the protrusion of comb fingers, whereas the direction of an electrostatic force in the 3-dimensional comb driver according to the present invention is perpendicular to that of protrusion of comb fingers.

Thirdly, the 3-dimensional comb driver according to the present invention is stronger than the existing comb driver, so that it can increase the driving displacement by which a suspension structure is driven.

Fourthly, since the comb structure according to the present invention is strong, the suspension structure can be driven at an arbitrary frequency without the need to drive the suspension structure at the resonance point of the comb structure to move the comb structure. Therefore, when a sensor using the resonance such as microgyro is manufactured using the comb structure according to the present invention, a resonance frequency in the excitation direction of the structure does not need to be consistent with a resonance frequency in the sensing direction thereof.

Fifthly, the comb driver according to the present invention can generate a sufficiently large force at a small amount of driving voltage, so that the comb structure according to the present invention can be driven with a lower voltage than the existing comb driver.

What is claimed is:

1. A 3-dimensional comb structure comprising:
   a substrate;
   a suspension structure separated a predetermined height from the substrate, maintaining the predetermined height therefrom, such that the suspension structure can vibrate over the substrate;
   at least one elastic member connected to the suspension structure, for supporting the suspension structure so that the suspension structure makes an inertial movement;
   a movable comb having at least one comb finger, the movable comb protruding from the suspension structure; and
   a fixed comb having at least one comb finger, the fixed comb fingers protruding from the substrate opposite to and in mesh with the movable comb fingers.

2. The 3-dimensional comb structure of claim 1, wherein an electrostatic force is generated perpendicular to the direction of protrusion of the movable comb fingers from the suspension structure, when a voltage is applied to the movable comb and the fixed comb, so that the 3-dimensional comb structure is excited parallel to the substrate.

3. The 3-dimensional comb structure of claim 1, wherein the movable comb is meshed with the fixed comb having a predetermined gap between a finger of the movable comb and a finger of the fixed comb.

4. The 3-dimensional comb structure of claim 1, wherein the suspension structure and the movable comb are incorporated into a single body, and make horizontal vibration with respect to the substrate.

5. The 3-dimensional comb structure of claim 1, wherein the movable comb and the fixed comb face each other, and are arranged on the suspension structure and the substrate, respectively, in a circular symmetrical manner, such that the suspension structure is horizontal to the substrate and rotates around the center of the circular symmetry.

6. The 3-dimensional comb structure of claim 1, wherein the movable comb protrudes perpendicularly from the suspension structure, and the fixed comb protrudes perpendicularly from the substrate.

7. The 3-dimensional comb structure of claim 1, wherein the interval between the movable comb and the fixed comb is constant.

8. The 3-dimensional comb structure of claim 1, wherein an electrostatic force, which is generated according to a change in the relative distance between the movable comb and the fixed comb, is constant when a constant voltage is applied between the movable comb and the fixed comb.

9. An inertia detection sensor adopting a 3-dimensional comb structure comprising:
   a substrate;
   a suspension structure separated a predetermined height from the substrate, maintaining the predetermined height therefrom, such that the suspension structure can vibrate over the substrate;
   at least one elastic member connected to the suspension structure, for supporting the suspension structure so that the suspension structure makes an inertial movement;
   a movable comb having at least one comb finger, the movable comb protruding from the suspension structure;
   a fixed comb having at least one comb finger, the fixed comb fingers protruding from the substrate opposite to and in mesh with the movable comb fingers; and
   a sensing unit for detecting an acceleration by sensing a capacity change between the movable comb and the fixed comb.

10. The inertia detection sensor adopting a 3-dimensional comb structure of claim 9, wherein an electrostatic force is generated perpendicular to the direction of protrusion of the movable comb fingers from the suspension structure, when a voltage is applied to the movable comb and the fixed comb, so that the 3-dimensional comb structure is excited parallel to the substrate.

11. The inertial detection sensor adopting a 3-dimensional comb structure of claim 9, wherein the movable comb is meshed with the fixed comb having a predetermined gap between a finger of the movable comb and a finger of the fixed comb.

12. The inertial detection sensor adopting a 3-dimensional comb structure of claim 9, wherein the suspension structure and the movable comb are incorporated into a single body, and make horizontal vibration with respect to the substrate.

13. The inertial detection sensor adopting a 3-dimensional comb structure of claim 9, wherein the movable comb and the fixed comb face each other, and are arranged on the suspension structure and the substrate, respectively, in a circular symmetrical manner, such that the suspension structure is horizontal to the substrate and rotates around the center of the circular symmetry.

14. The inertial detection sensor adopting a 3-dimensional comb structure of claim 9, wherein the movable comb protrudes perpendicularly from the suspension structure, and the fixed comb protrudes perpendicularly from the substrate.

15. The inertial detection sensor adopting a 3-dimensional comb structure of claim 9, wherein the interval between the movable comb and the fixed comb is constant.

16. The inertial detection sensor adopting a 3-dimensional comb structure of claim 9, wherein an electrostatic force, which is generated according to a change in the relative distance between the movable comb and the fixed comb, is constant when a constant voltage is applied between the movable comb and the fixed comb.

17. An actuator adopting a 3-dimensional comb structure comprising:
   a substrate;
   a suspension structure separated a predetermined height from the substrate, maintaining the predetermined height therefrom, such that the suspension structure can vibrate over the substrate;
   at least one elastic member connected to the suspension structure, for supporting the suspension structure so that the suspension structure makes an inertial movement;

a movable comb having at least one comb finger, the movable comb protruding from the suspension structure;

a fixed comb having at least one comb finger, the fixed comb fingers protruding from the substrate opposite to and in mesh with the movable comb fingers; and a power supply for providing a voltage between the movable comb and the fixed comb to excite the suspension structure.

18. The actuator adopting a 3-dimensional comb structure of claim 17, wherein an electrostatic force is generated perpendicular to the direction of protrusion of the movable comb fingers from the suspension structure, when a voltage is applied to the movable comb and the fixed comb, so that the 3-dimensional comb structure is excited perpendicular to the direction of protrusion of the fixed comb.

19. The actuator adopting a 3-dimensional comb structure of claim 17, wherein the movable comb is meshed with the fixed comb having a predetermined gap between a finger of the movable comb and a finger of the fixed comb.

20. The actuator adopting a 3-dimensional comb structure of claim 17, wherein the movable comb and the fixed comb are arranged in a circular symmetrical manner to face each other, such that the suspension structure rotates around the center of the circular symmetry.

21. The actuator adopting a 3-dimensional comb structure of claim 17, wherein the movable comb protrudes perpendicularly from the suspension structure, and the fixed comb protrudes from the substrate in parallel to the movable comb.

22. The actuator adopting a 3-dimensional comb structure of claim 17, wherein the interval between the movable comb and the fixed comb is constant.

23. The actuator adopting a 3-dimensional comb structure of claim 17, wherein an electrostatic force, which is generated according to a change in the relative distance between the movable comb and the fixed comb, is constant when a constant voltage is applied between the movable comb and the fixed comb.

* * * * *